(12) United States Patent
Takezawa et al.

(10) Patent No.: US 7,884,544 B2
(45) Date of Patent: Feb. 8, 2011

(54) SEMICONDUCTOR LIGHT EMITTING DEVICE HAVING MIXED LIGHT EMISSION

(75) Inventors: Hatsuo Takezawa, Kanagawa-ken (JP); Kenji Shimomura, Kanagawa-ken (JP); Hiroaki Oshio, Fukuoka-ken (JP); Yasuhiro Shirakawa, Kanagawa-ken (JP); Tsutomu Ishii, Kanagawa-ken (JP)

(73) Assignees: Kabushiki Kaisha Toshiba, Tokyo (JP); Toshiba Materials Co., Ltd., Yokahama-shi, Kanagawa-ken (JP)

( * ) Notice: Subject to any disclaimer, the term of this patent is extended or adjusted under 35 U.S.C. 154(b) by 630 days.

(21) Appl. No.: 11/216,455

(22) Filed: Sep. 1, 2005

(65) Prior Publication Data

US 2006/0071591 A1  Apr. 6, 2006

(30) Foreign Application Priority Data

Sep. 2, 2004  (JP) .............................. 2004-255809

(51) Int. Cl.
*H01J 1/62* (2006.01)
(52) U.S. Cl. .................. 313/512; 313/501; 313/502; 313/503; 313/506
(58) Field of Classification Search .......... 313/498–512
See application file for complete search history.

(56) References Cited

U.S. PATENT DOCUMENTS

2003/0214233 A1* 11/2003 Takahashi et al. ........... 313/512
2004/0066140 A1  4/2004 Omoto
2004/0104672 A1*  6/2004 Shiang et al. ............... 313/506

FOREIGN PATENT DOCUMENTS

| CN | 1380703 | 11/2002 |
|---|---|---|
| JP | 2001-148516 | 5/2001 |
| JP | 2002-374006 A | 12/2002 |
| JP | 2003-179269 A | 6/2003 |
| JP | 2003-324215 | 11/2003 |
| JP | 2004-088009 | 3/2004 |
| JP | 2004-088011 | 3/2004 |
| JP | 2004-161789 | 6/2004 |
| JP | 2004-161807 | 6/2004 |
| JP | 2004-161863 | 6/2004 |

OTHER PUBLICATIONS

TW Office Action dated Mar. 30, 2007, TW Appln. 094129783.
Chinese Office Action for Chinese Patent Application 200510119927.8, dated May 11, 2007.
CN Office Action dtd Feb. 15, 2008, CN App. 2005101199278.
JP Office Action dtd Jan. 26, 2010, JP Appln. 2004-255809, English translation.
JP Office Action dtd Aug. 25, 2010, JP Appln. 2004-255809, English Translation.

* cited by examiner

*Primary Examiner*—Bumsuk Won
(74) *Attorney, Agent, or Firm*—Banner & Witcoff, Ltd.

(57) ABSTRACT

A semiconductor light emitting device includes a semiconductor light emitting element that emits light of a first wavelength, at least two kinds of phosphors that absorb the light of the first wavelength and then emit wavelength-converted light, sealing resin in which the at least two kinds of phosphors are dispersed and the semiconductor light emitting element is embedded, and binder resin. Combined bodies in which the at least two kinds of phosphors are combined by the binder resin are dispersed in the sealing resin.

22 Claims, 11 Drawing Sheets

SEMICONDUCTOR LIGHT EMITTING DEVICE HAVING MIXED LIGHT EMISSION

CROSS-REFERENCE TO RELATED APPLICATIONS

This application is based upon and claims the benefit of priority from the prior Japanese Patent Application No. 2004-255809, filed on Sep. 2, 2004; the entire contents of which are incorporated herein by reference.

BACKGROUND OF THE INVENTION

1. Field of the Invention

This invention relates to a semiconductor light emitting device based on a semiconductor light emitting element such as a light emitting diode (LED), and more particularly to a semiconductor light emitting device for use in a white light source including a semiconductor light emitting element combined with phosphors.

2. Background Art

In recent years, semiconductor light emitting devices have been widely used for various light sources including illumination and display devices. In particular, realization of blue light emitting elements and ultraviolet elements made of GaN-based material has dramatically extended the application of white light emitting devices. It is to be expected that applications in LCD backlights, large screen or other displays, and illumination lamps, among others, will be further extended in the future.

Such a semiconductor light emitting device can be implemented by a combination of a semiconductor light emitting element for emitting short wavelength light and phosphors for converting the wavelength of the emission. That is, several kinds of phosphors for emitting light at different wavelengths can be mixed to obtain light emission with a predetermined spectrum.

For example, a desired emission color can be achieved by appropriately selecting a compounding ratio of three kinds of phosphors that absorb ultraviolet radiation and convert the wavelength to blue, green, and red light, respectively (e.g., Japanese Laid-Open Patent Application 2003-324215). For achieving white light emission, there exists an optimal compounding ratio of phosphors corresponding thereto. Alternatively, white light can also be achieved by irradiating blue and yellow light emitting phosphors with ultraviolet radiation and mixing the emitted blue and yellow light.

However, different kinds of phosphors have different specific gravities and grain size distributions, respectively. This causes a problem that various factors in the manufacturing process lead to the color tone variation of products and the decrease of production yield.

This problem may be addressed by, for example, using a single kind of phosphors in conjunction with a blue light emitting element. More specifically, yellow light obtained by irradiating yellow phosphors with blue light can be mixed with blue light from the light emitting element to obtain white light.

In this case, however, there is a problem that the color tone is unstable in response to the variation of ambient temperature because the temperature dependence of light emission in the light emitting element is different from the temperature dependence of wavelength conversion in the phosphors. Moreover, the combination of a semiconductor light emitting element and a single kind of phosphors is also unfavorable because the achievable color range is limited to composites of the two colors.

SUMMARY OF THE INVENTION

According to an aspect of the invention, there is provided a semiconductor light emitting device comprising:
a semiconductor light emitting element that emits light of a first wavelength;
at least two kinds of phosphors that absorb the light of the first wavelength and then emit wavelength-converted light;
sealing resin in which the at least two kinds of phosphors are dispersed and the semiconductor light emitting element is embedded; and
binder resin,
combined bodies in which the at least two kinds of phosphors are combined by the binder resin being dispersed in the sealing resin.

According to other aspect of the invention, there is provided a semiconductor light emitting device comprising:
a semiconductor light emitting element that emits light of a first wavelength;
phosphor particles that absorb the light of the first wavelength and then emit wavelength-converted light;
sealing resin in which the phosphor particles are dispersed and the semiconductor light emitting element is embedded; and
binder resin,
combined bodies in which the phosphor particles are combined together by the binder resin being dispersed in the sealing resin.

According to other aspect of the invention, there is provided a semiconductor light emitting device comprising:
a semiconductor light emitting element that emits light of a first wavelength;
at least two kinds of phosphors that absorb the light of the first wavelength and then emit wavelength-converted light; and
sealing resin in which the at least two kinds of phosphors are dispersed and the semiconductor light emitting element is embedded,
at least one kind of phosphors of the at least two kinds of phosphors having a surface on which fine powder is attached, and being dispersed in the sealing resin, the fine powder being made of material different from and having a smaller grain size than both the at least two kinds of phosphors.

DETAILED DESCRIPTION OF THE INVENTION

Embodiments of the invention will now be described with reference to the drawings.

Figure 1:
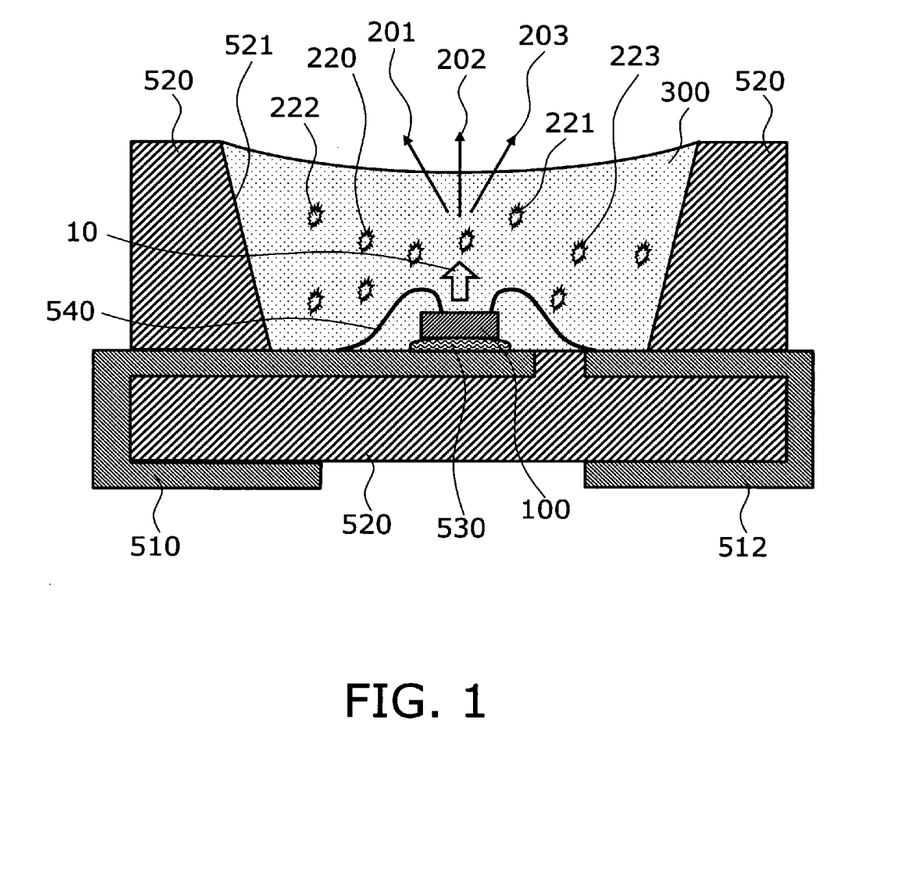
FIG. 1 is a schematic cross section illustrating the structure of a relevant part of a semiconductor light emitting device according to a first embodiment of the invention.

FIG. 1 is a schematic cross section illustrating the structure of a relevant part of a semiconductor light emitting device according to a first embodiment of the invention.

More specifically, the semiconductor light emitting device of this embodiment is of a type of surface mounted device (SMD) suitable to high density packaging on a mounting board. A semiconductor light emitting element 100 is bonded onto a first lead 510 using an adhesive 530. A first electrode provided on the upper face of the semiconductor light emitting element 100 is connected to the first lead 510 via a bonding wire 540. A second electrode provided on the upper face of the semiconductor light emitting element 100 is connected to a second lead 512 via a bonding wire. The leads 510 and 512, in the state of being connected onto a lead frame in advance, are embedded and fixed in thermoplastic resin 520 by injection molding or the like. Photoreflective material can be mixed in the thermoplastic resin 520 to form a photoreflective bevel 521 after the leads 510 and 512 are embedded.

The semiconductor light emitting element 100 is made of, for example, GaN-based or InGaAlP-based material. A GaN-based light emitting element emits ultraviolet radiation in the wavelength band of, for example, 330 to 400 nanometers. An InGaAlP-based light emitting element emits visible light in the wavelength band of, for example, 400 to 700 nanometers.

The semiconductor light emitting element 100 is sealed with transparent resin 300. Combined phosphors 220, 221, 223 are dispersed in the transparent resin 300. Primary light emitted from the semiconductor light emitting element 100 is absorbed in the combined phosphors 220, 221, 223, which convert the wavelength to emit secondary light.

Figure 2:
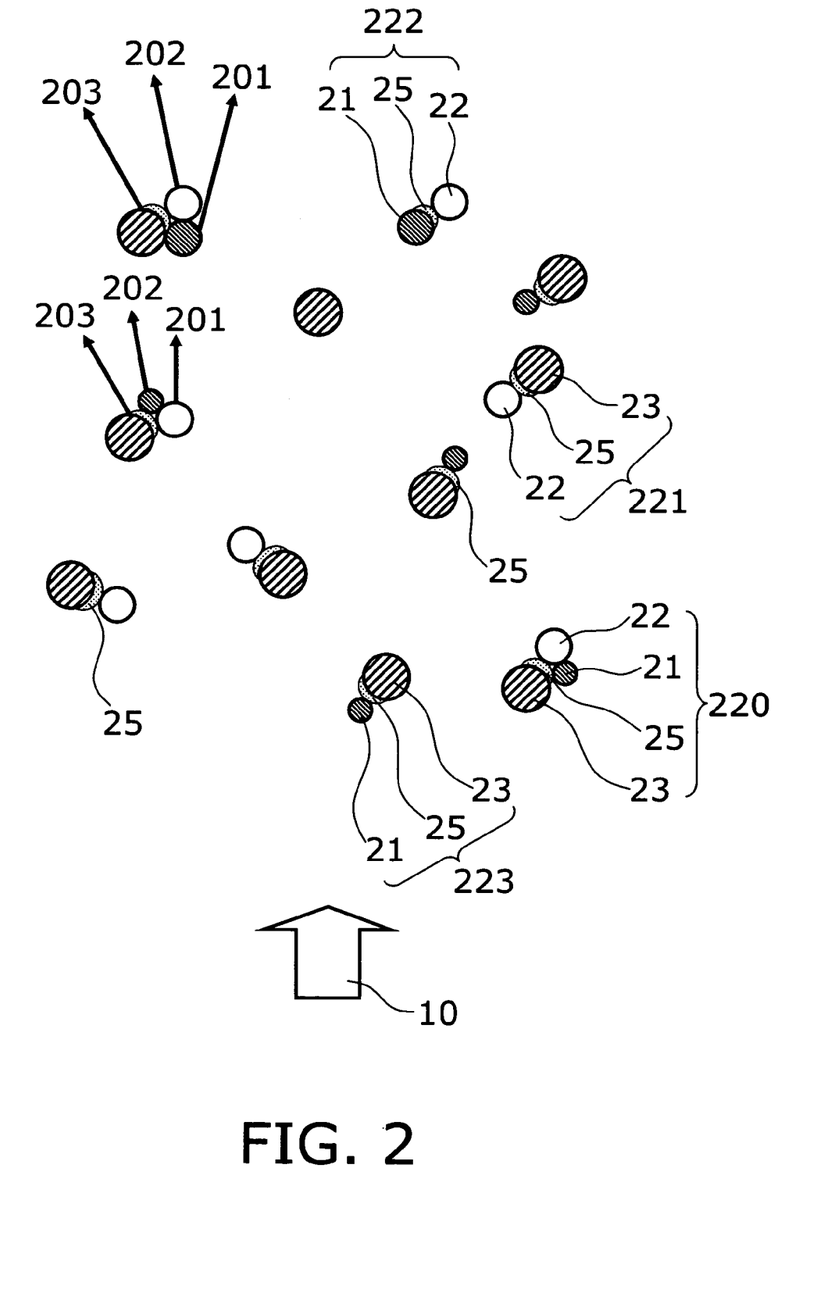
FIG. 2 is a schematic view illustrating combined phosphors being dispersed in the transparent resin 300 in the semiconductor light emitting device according to the first embodiment.

FIG. 2 is a schematic view illustrating combined phosphors being dispersed in the transparent resin 300 in the semiconductor light emitting device according to this embodiment.

The combined phosphors 220 to 223 are composed of blue phosphors 21, green phosphors 22, and red phosphors 23 combined by binder resin 25. In order to obtain desired white light, preferably, these phosphors 21, 22, 23 are combined at a predetermined compounding ratio. The blue phosphor 21 may be, for example, $(Sr,Ca,Ba,Eu)_{10}(PO_4)_6:Cl_2$. The green phosphor 22 may be, for example, $3(Ba,Mg,Eu,Mn)O:8Al_2O$. The red phosphor 23 may be, for example, $La_2O_2S:(Eu,Sm)$.

In order to obtain white light by three-color mixing, the red phosphors 23, having lower emission intensity than the other phosphors, must be contained at a higher compounding ratio (weight ratio). An example compounding ratio, expressed by weight ratio, is blue:green:red=0.7:1:5. Typically, red phosphors 23 have a grain size of about 5 to 15 micrometers (μm). Blue phosphors 21 and green phosphors 22 have a grain size of about 3 to 12 micrometers. Red phosphors 23 have a specific gravity of about 5.7, which is larger than that of blue phosphors 21 (about 4.2) and green phosphors 22 (about 3.8). For this reason, red phosphors 23 have a larger sedimentation rate in the transparent resin 300 before curing.

The sedimentation rate of phosphors (combined phosphors) in liquid transparent resin before the transparent resin 300 is cured can be approximated by the Stokes' formula. That is, the sedimentation rate of phosphors is proportional to (grain size squared×specific gravity).

Since red phosphors 23 with a high compounding ratio typically have a large grain size, the sedimentation rate of red phosphors 23 is further increased.

Figure 3:
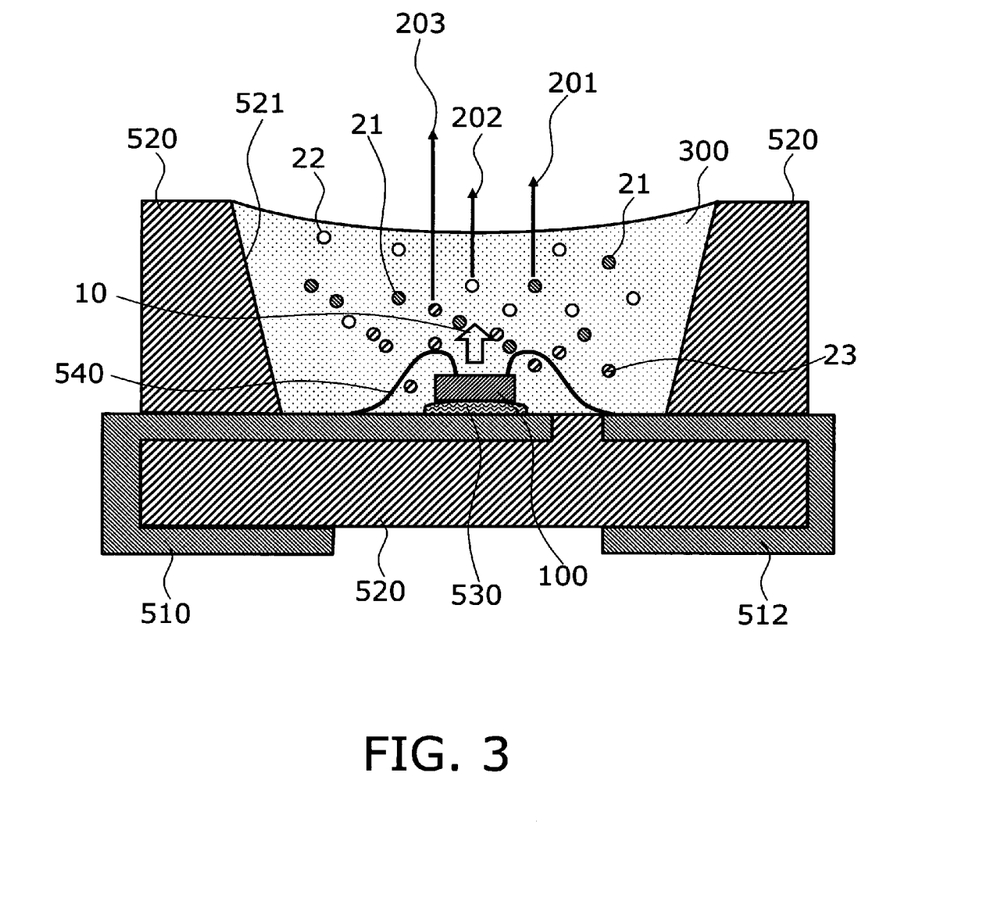
FIG. 3 is a cross section that schematically shows a semiconductor light emitting device of a comparative example investigated by the inventors in the course of reaching the invention.

FIG. 3 is a cross section that schematically shows a semiconductor light emitting device of a comparative example investigated by the inventors in the course of reaching the invention. The semiconductor light emitting device of this comparative example is also a surface mounted light emitting device (SMD). With regard to this figure, elements similar to those described above with reference to FIGS. 1 and 2 are marked with the same reference numerals and will not be described in detail.

The semiconductor light emitting element 100 is sealed with transparent resin 300. The transparent resin 300 before heat curing is in liquid form, in which phosphors (for light emission in blue 21, green 22, and red 23) are mixed at a predetermined compounding ratio. These phosphors serve to absorb ultraviolet radiation emitted from the semiconductor light emitting element 100 and convert the wavelength into blue light 201, green light 202, and red light 203. A desired emission color can be achieved by appropriately selecting the compounding ratio of the phosphors.

However, the following problem occurs in the semiconductor light emitting device of this comparative example. Different kinds of phosphors have different specific gravities and grain size distributions, respectively. As a result, even if these phosphors are mixed in liquid transparent resin material (before heat curing) at a predetermined compounding ratio, the difference in sedimentation rate causes nonuniformity of compounding ratio in the dispenser before the resin material is injected around the semiconductor light emitting element 100. Similarly, even after the resin material is injected around the semiconductor light emitting element 100, sedimentation proceeds until heat curing, which causes the compounding ratio of phosphors to depend on their position in the transparent resin 300.

As illustrated in FIG. 3, red phosphors 23, having a larger specific gravity than the other phosphors, sediment faster than the other phosphors (blue phosphors 21 and green phosphors 22). In addition, red phosphors, having lower emission intensity than the other phosphors, must be contained at a higher compounding ratio (weight ratio). To this end, it is preferable to increase the grain size. However, as described above, the sedimentation rate in the liquid transparent resin 300 is approximately proportional to the grain size squared. Therefore the sedimentation rate of red phosphors 23 is further increased.

For this reason, a large amount of red phosphors 23 are distributed near the semiconductor light emitting element 100 and subjected to heat curing. Ultraviolet radiation 10 emitted from the semiconductor light emitting element 100 is converted into red light 203 upon absorption by a red phosphor 23, blue light 201 upon absorption by a blue phosphor 21, and green light 202 upon absorption by a green phosphor 22.

However, since a large amount of red phosphors 23 are distributed near the semiconductor light emitting element 100, much of the ultraviolet radiation serving as primary light is absorbed by the red phosphors 23. This results in a color tone with enhanced red.

Figure 4:
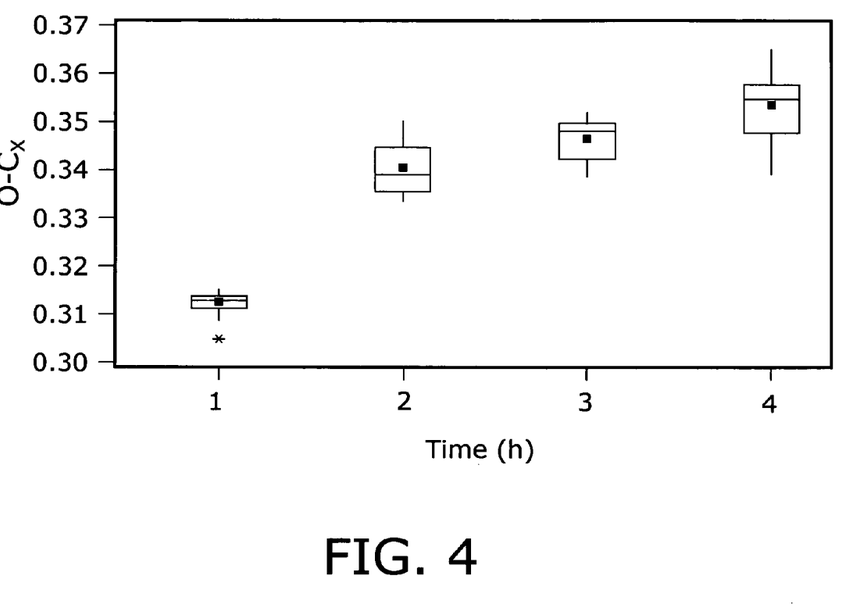
FIG. 4 is a graphical diagram showing, by a boxplot, the results of experiments indicating the influence of elapsed time on the color tones.

FIG. 4 is a graphical diagram showing, by a boxplot, the results of experiments indicating the influence of elapsed time on the color tones.

More specifically, the horizontal axis in this figure represents the duration of time after three-color phosphors are mixed in liquid resin 300 and injected around the semiconductor light emitting element 100 by a dispenser until heat curing is started. The vertical axis represents a color tone of the completed white light emitting device using the color coordinate O-Cx. The average value is indicated by a solid square.

It can be seen from FIG. 4 that as the elapsed time before starting heat curing increases, the color coordinate Cx and its variation become larger, thereby increasing the variation of color tone. In mass production, a certain range (variation) unavoidably occurs in the duration of time after injecting the liquid transparent resin 300 until starting heat curing. This results in the color tone variation of products and naturally the production yield also decreases.

In order to prevent this problem, preferably, red phosphors 23 are not arranged alone, but are combined with phosphors of other colors. While it is preferable to combine three kinds of phosphors all together, it is not always achievable in view of the relation between the compounding ratio and the individual grain sizes. This embodiment primarily discloses combined phosphors in the following four types of combinations, although other combinations are possible (for example, combination of phosphors of the same kind).

The combined phosphor 220 is made of three kinds of phosphors (red, blue, and green) combined by binder resin 25. The combined phosphor 221 is made of two kinds of phosphors (red and green) combined by binder resin 25. The combined phosphor 222 is made of two kinds of phosphors (green and blue) combined by binder resin 25. Finally, the combined phosphor 223 is made of two kinds of phosphors (red and blue) combined by binder resin 25.

These combinations can prevent the red phosphors 23 from sedimenting independently, thereby significantly alleviating the enhancement of red.

As illustrated in FIG. 1, the combined phosphor absorbs ultraviolet radiation 10, for example, and the individual phosphors perform wavelength conversion to emit blue light 201, green light 202, and red light 203, respectively. White light is obtained as a mixture of these three colors.

As described above, combined phosphors can be formed and dispersed in transparent resin 300 to prevent only the red phosphors 23 having a large specific gravity from being localized around the light emitting element 100. Such combined phosphors can be formed by mixing individual phosphors at a predetermined compounding ratio and then combining the phosphor particles together by binder resin. The method therefor will be described later in detail.

Figure 5:
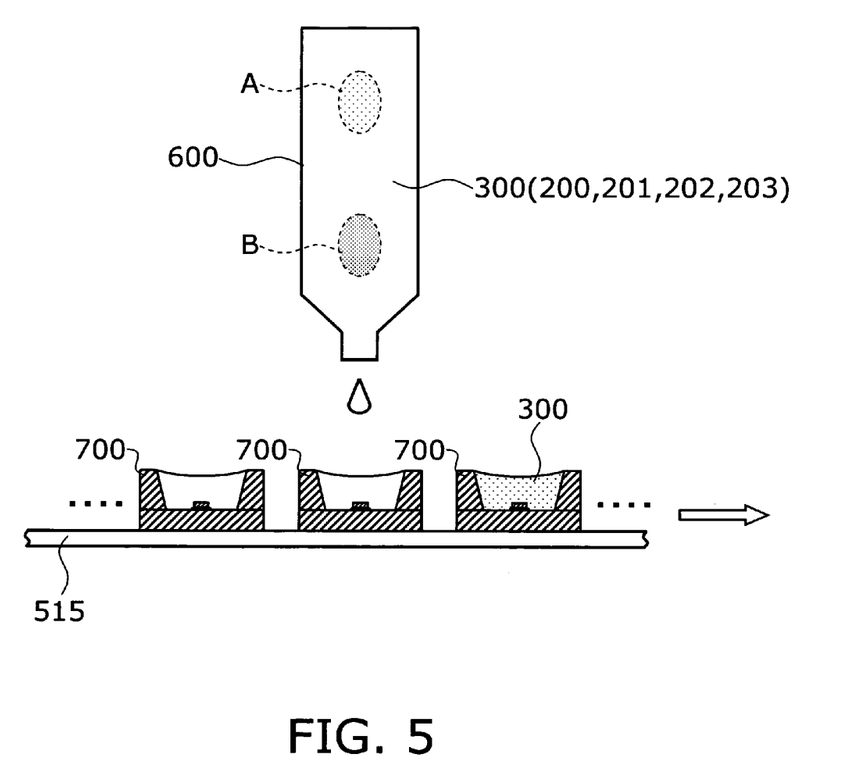
FIG. 5 is a schematic view illustrating part of the process of assembling a semiconductor light emitting device according to the first embodiment.

FIG. 5 is a schematic view illustrating part of the process of assembling a semiconductor light emitting device according to this embodiment.

The combined phosphors 200 to 203 are mixed in liquid transparent resin 300 before heat curing and dropped (injected) on the light emitting element 100 using a dispenser 600. Preferably, the combined phosphors are mixed in the liquid transparent resin 300 at a weight ratio of 20 to 30%. In the mass production process, a large number of semiconductor light emitting devices 700 before injection of transparent resin are aligned on a lead frame 515, and successively subjected to injection of liquid transparent resin. At this time, the lead frame is automatically conveyed in the direction indicated by the arrow. Subsequently, the heat curing process is performed to form the transparent resin 300. Examples of the transparent resin 300 include epoxy resin, polycarbonate, polystyrene, acrylic resin, and silicone resin. Among them, in particular, silicone resin is free from degradation such as discoloration due to ultraviolet radiation emitted from the semiconductor light emitting element 100 and achieves stable emission characteristics over time.

Sedimentation of phosphors begins when they are mixed in liquid transparent resin 300. In the dispenser 600 for mass production, it may take several hours from mixing of phosphors until injection of resin 300 on the light emitting element 100. During this time, sedimentation of the phosphors proceeds.

In FIG. 5, parts A and B are partially enlarged views that schematically show the combined phosphors being mixed in the liquid transparent resin. As illustrated, the concentration of combined phosphors is lower in the upper part A than in the lower part B. Even the concentration of combined phosphors is varied, the three kinds of phosphors are mixed at a predetermined compounding ratio both in the part A and in the part B. As a result, in no case a light emitting device with enhanced red is reluctantly produced like the comparative example. In addition, if the content of the dispenser 600 is stirred at a regular time interval during production, the concentration difference between the parts A and B can be made very small.

Figure 6:
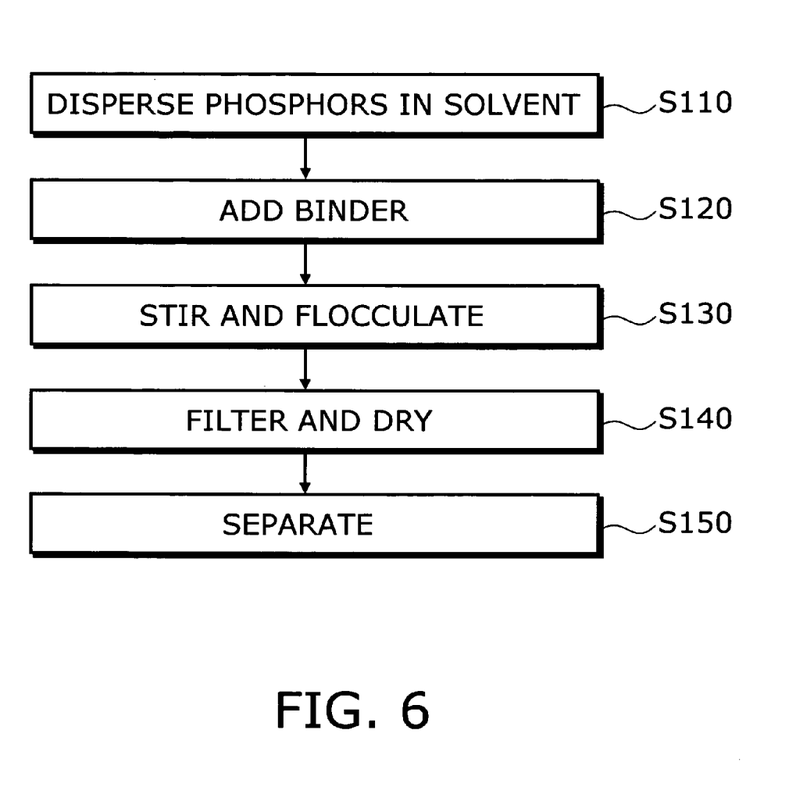
FIG. 6 is a flow chart illustrating a method of forming the combined phosphors.

Next, a method of forming the combined phosphors 200 to 203 is described.

FIG. 6 is a flow chart illustrating a method of forming the combined phosphors.

First, at least two kinds of phosphors weighed at a predetermined ratio are dispersed in liquid (step S110). Solvent for dispersing phosphors may be, for example, water or organic solvent such as alcohol.

Next, binder is added (step S120). The binder may be, for example, acrylic resin or silicone-based resin. While acrylic resin has high binding strength, it may suffer from discoloration due to short wavelength light emitted from the semiconductor light emitting element, which may decrease luminous intensity.

The concentration of binder relative to the solvent can be, for example, 0.01 to 0.5 percent. In addition, the order of the steps S110 and S120 can be exchanged. That is, binder may be added to solvent in advance, and then the phosphors may be dispersed in the solvent.

Next, by stirring (e.g., for one hour), the phosphors are flocculated (step S130). The phosphor particles dispersed in the solvent are flocculated together. The binding of the phosphor particles is facilitated by binder resin coatings.

This is followed by filtration and drying (step S140), and then a sieve (e.g., 200 mesh) is used for separation (step S150).

Figure 7:
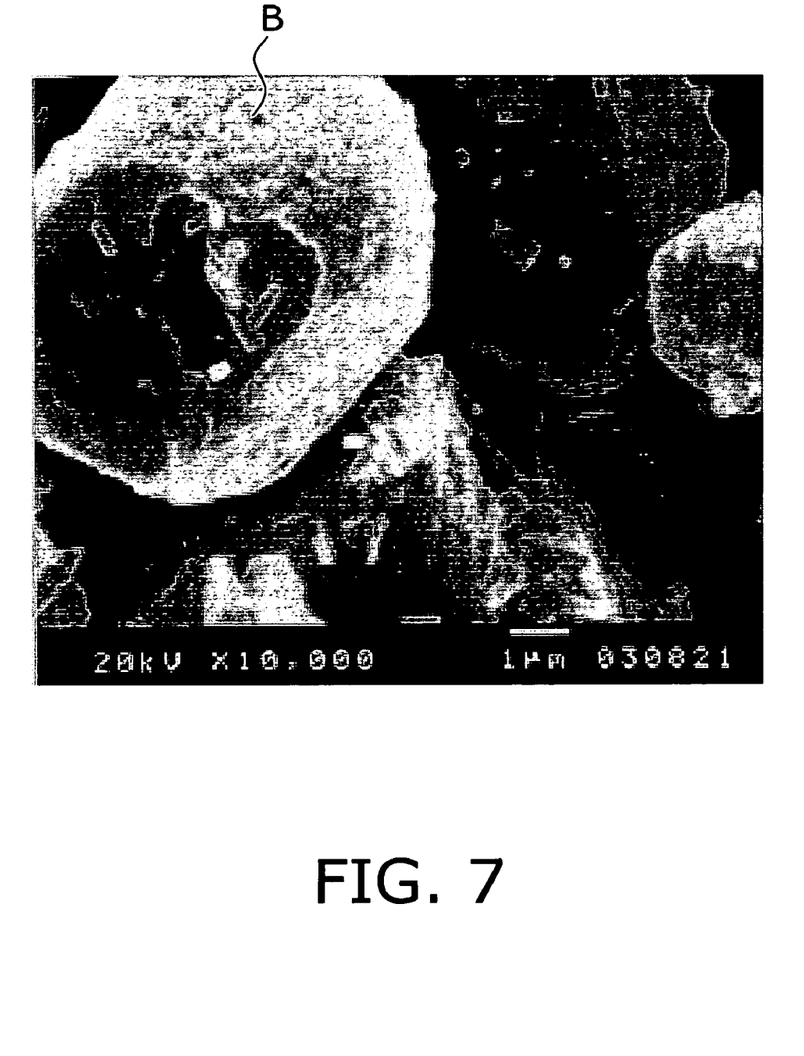
FIG. 7 is a SEM (Scanning Electron Microscopy) photograph showing the combined phosphors formed by the combining process in a magnified form.

FIG. 7 is a SEM (Scanning Electron Microscopy) photograph showing the combined phosphors formed by this combining process in a magnified form.

As shown, a binder coating B is formed on the surface of a phosphor particle, and adjacent phosphor particles are combined together by the coating B.

Figure 8:
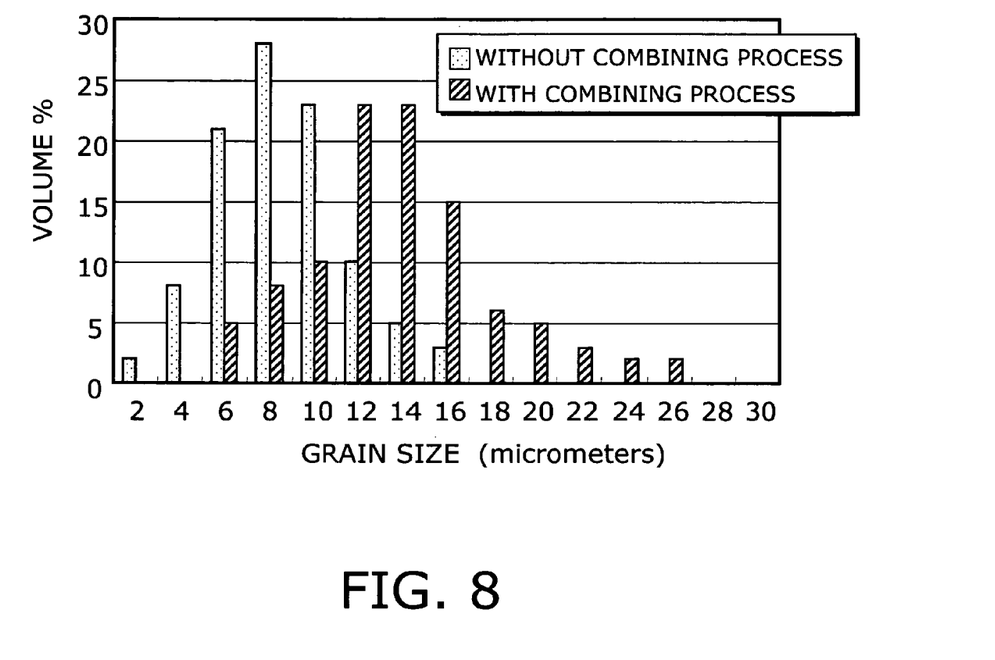
FIG. 8 is a graphical diagram illustrating the change of grain size distributions due to the presence or absence of the combining process.

FIG. 8 is a graphical diagram illustrating the change of grain size distributions due to the presence or absence of the combining process.

More specifically, the horizontal axis in this figure represents the average grain size (in micrometers) of phosphors (combined phosphors). The vertical axis represents the volume ratio (in percent) for which particles in each grain size group account in all the phosphors.

In this example, the average grain size of phosphors before the combining process is 9 (red), 7 (green), and 6 (blue) micrometers. The compounding ratio (weight ratio) is red: green:blue=5:1:0.7.

When the combining process is not applied, the average grain size is 6 to 10 micrometers. However, the combining process using binder resin increases the average grain size of combined phosphors to 12 to 16 micrometers, which indicates that the phosphor particles are combined.

It is preferable to reduce the duration of time after phosphors are dispersed in transparent resin 300 and injected onto the light emitting element 100 until the resin 300 is heat cured. However, it may take several hours in an actual mass production process. Sedimentation of the phosphors (combined phosphors) proceeds also during this time.

Figure 9:
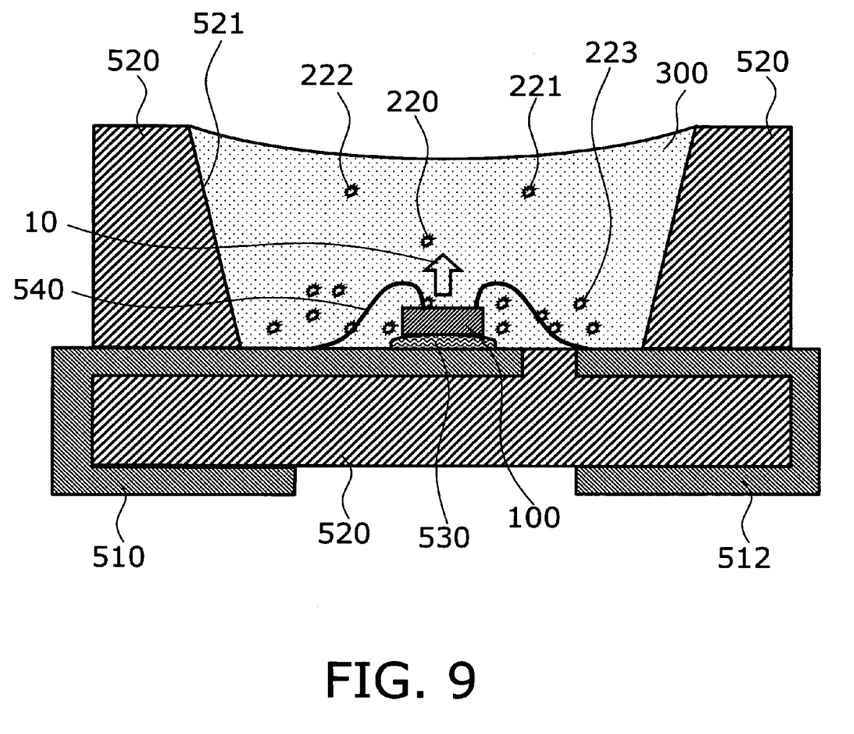
FIG. 9 is a schematic view showing the combined phosphors having sedimented near the semiconductor light emitting element 100.

FIG. 9 is a schematic view showing the combined phosphors having sedimented near the semiconductor light emitting element 100.

As shown in this figure, combined phosphors 220, 221, 222, 223 have sedimented near the semiconductor light emitting element 100. However, according to this embodiment, even if such sedimentation occurs, the variation of color tone can be reduced to a very small range because the compounding ratio of blue, green, and red phosphors is fixed. According to the trial production by the inventors, the chromaticity variation on the color coordinate is ±0.024 for the comparative example described above with reference to FIGS. 3 and 4, whereas the chromaticity variation can be reduced within ±0.005 for the semiconductor light emitting device according to this embodiment. As a result, a characteristic distribution (especially in color tone) with a very small variance is reproducibly obtained, which is very favorable to mass production.

On the other hand, the brightness of phosphors depends on their grain size. For example, blue phosphors have 10 to 15% higher brightness for a grain size of 15 micrometers than for a grain size of 6 micrometers. However, as the grain size of phosphors increases, the sedimentation rate becomes faster, which results in the increase of chromaticity variation and the decrease of production yield. In contrast, according to this embodiment, the chromaticity variation can be reduced by the process of combining phosphors together even if the grain size is increased. This enables mass production of high brightness lamps.

In a semiconductor light emitting device, since the semiconductor light emitting element 100 and phosphors are placed in close proximity, any dependence of the distribution of phosphors on their color significantly affects the entire color tone. It is therefore important to fix the compounding ratio of phosphors independent of the distance from the excitation light source (i.e., semiconductor light emitting element) as compared to fluorescent lamps. In this respect, according to this embodiment, by applying the combining process to phosphors to form combined phosphors, the compounding ratio of phosphors can be fixed independent of the distance from the semiconductor light emitting element as compared to fluorescent lamps, and the variation and dispersion of chromaticity can be reduced definitely and easily.

Figure 10A:
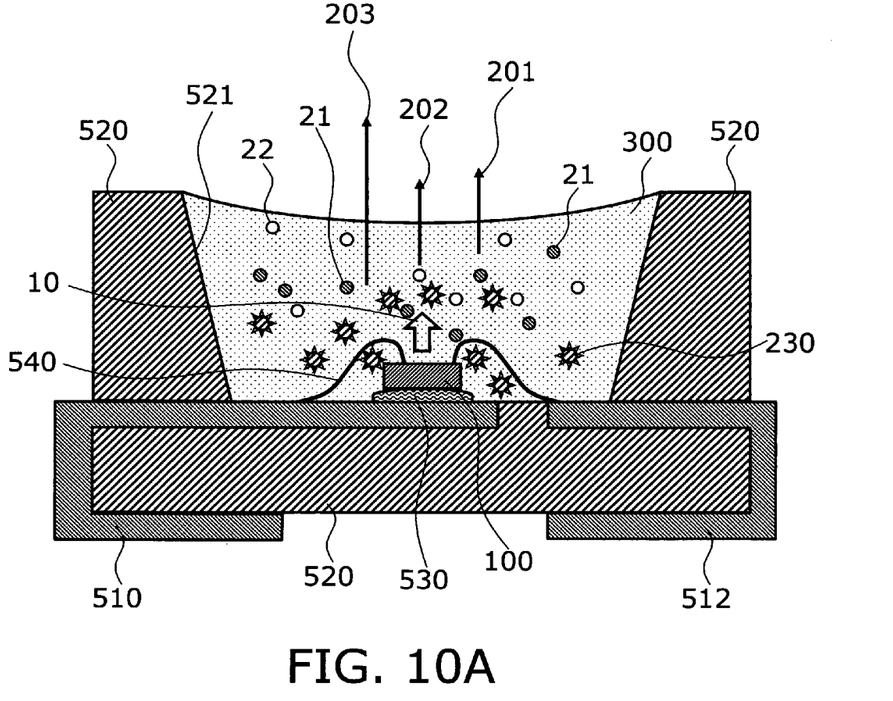
FIG. 10A is a schematic cross section illustrating the structure of a relevant part of a semiconductor light emitting device according to a second embodiment of the invention.

Next, a second embodiment of the invention is described.

Figure 10B:
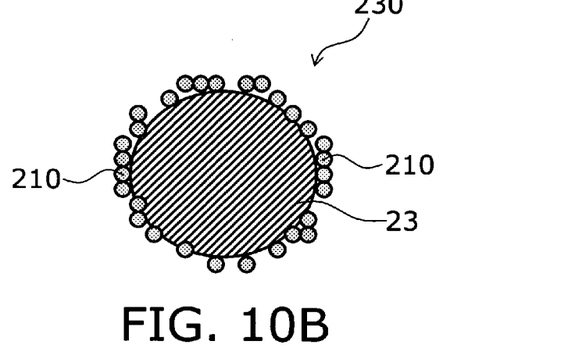
FIG. 10B is an enlarged schematic cross section of the phosphors.

FIG. 10A is a schematic cross section illustrating the structure of a relevant part of a semiconductor light emitting device according to a second embodiment of the invention. FIG. 10B is an enlarged schematic cross section of the phosphors.

With regard to these figures again, elements similar to those described above with reference to FIGS. 1 to 9 are marked with the same reference numerals and will not be described in detail.

In this embodiment, transparent fine powder 210 is attached to the surface of the phosphors (e.g., red phosphors 23) being likely to sediment, among several kinds of phosphors (e.g., blue phosphors 21, green phosphors 22, and red phosphors 23), thereby forming powder-attached phosphors 230. The transparent fine powder 210 is made of material different from the phosphor 23, and has a smaller grain size than the phosphor 23. The transparent fine powder 210 may be made of, for example, material having good transmissivity to visible light or ultraviolet radiation such as silica or alumina. Silica and alumina can be surface modified (e.g., by attaching a certain functional group) to increase solvophilicity to liquid resin 300 before curing. As a result, the sedimentation rate can be decreased. In addition, the attached fine powder 210 prevents phosphor particles from being combined together, and thereby sedimentation due to increased grain size can be restrained.

Preferably, the average grain size of the fine powder 210 is in the range of 0.01 to 0.08 micrometer. If the average grain size exceeds 0.08 micrometer, the surface area of the fine powder 210 is decreased, which reduces the effect of increasing solvophilicity to resin. On the other hand, if the average grain size of the fine powder 210 falls below 0.01 micrometer, the fine particles of the powder are likely to flocculate together. As a result, it is difficult to obtain a monodisperse colloid that is desirable as a processing liquid for attaching the powder to the surface of the phosphor.

On the other hand, the fine powder is not attached to the blue phosphors 21 and green phosphors 22. As a result, the sedimentation rate of powder-attached phosphors relatively decreases and approaches the sedimentation rate of the blue and green phosphors.

After the powder-attached phosphors 230, blue phosphors 21, and green phosphors 22 are mixed in liquid transparent resin, the dispenser 600 is filled therewith as illustrated in FIG. 5. Subsequently, injection onto the light emitting element 100 and heat curing are performed. In this example, since the sedimentation rate of the powder-attached phosphors 230 (containing red phosphors 23 in this example) is made close to that of the blue phosphors 21 and green phosphors 22, excessive concentration of red phosphors as in the conventional art does not occur. That is, this embodiment can eliminate the problem that only the red phosphors 23 sediment around the semiconductor light emitting element 100 to bias chromaticity toward red. As a result, even in mass production, the difference of compounding ratio between the products can be reduced. For example, while the chromaticity variation is ±0.024 for a semiconductor light emitting device formed without attachment of fine powder 210, it can be reduced to ±0.013 in this example and thus the color tone variation is reduced. In this way enhancement of yield and productivity can be achieved.

In the second embodiment, each phosphor particle has a smaller grain size because the phosphors are not combined together, and therefore the sedimentation rate can be slower than in the first embodiment.

If the sedimentation in the dispenser 600 is faster, then in the process of dropping resin, the amount of phosphors in the semiconductor light emitting device dropped early in the process is increased, whereas the amount of phosphors in the semiconductor light emitting device dropped late in the process is decreased. Similarly, a semiconductor light emitting device subjected to dropping early in the process has a large amount of phosphors sedimenting around the semiconductor light emitting element 100, whereas a semiconductor light emitting device subjected to dropping late in the process has a small amount of phosphors sedimenting around the semiconductor light emitting element 100. That is, the content and/or distribution of phosphors may be different for each product and result in luminous intensity variation.

In contrast, according to the second embodiment, advantageously, the sedimentation rate of phosphors is not increased and therefore the luminous intensity variation for each product can be reduced.

While the semiconductor light emitting element 100 also has luminous intensity variation, it can be adjusted by using the driving current, for example. Therefore, a certain range of luminous intensity variation in the first embodiment could be fully addressed in practice.

Figure 11:
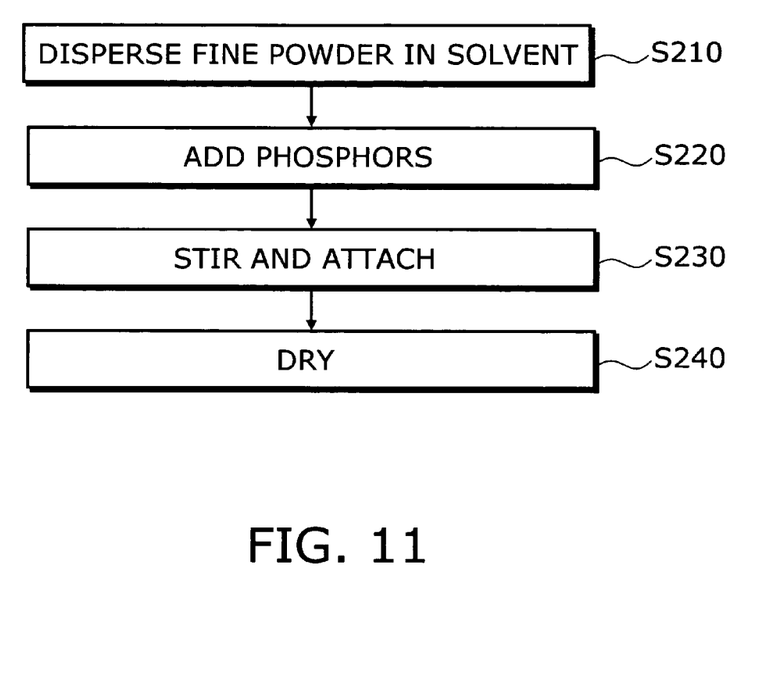
FIG. 11 is a flow chart showing a method of forming the powder-attached phosphors.

Next, a method of forming powder-attached phosphors 230 is described.

FIG. 11 is a flow chart showing a method of forming the powder-attached phosphors.

First, transparent fine powder 210 having good transmissivity to visible or ultraviolet light such as silica or alumina is charged into solvent such as water or organic solvent (e.g., alcohol) and sufficiently dispersed under ultrasonic waves (step S210). Subsequently, phosphors 23 is gradually added while stirring (step S220). After stirring is continued for a certain duration of time (step S230), the phosphor slurry is dried (e.g., at 100 to 150° C.) and thereby powder-attached phosphors 230 are obtained (step S240). The powder-attached phosphors 230 thus formed are mixed with other phosphors (e.g., green and blue phosphors) in liquid transparent resin (e.g., silicone or epoxy), and then dropped and heat cured.

Embodiments of the invention have been described with reference to examples. However, the invention is not limited to these examples.

For example, the semiconductor light emitting element 100 is not limited to InGaAlP-based and GaN-based elements. GaAlAs-based, InP-based, and various other group III-V compound semiconductors, or group II-VI compound semiconductors or various other semiconductors may be used.

Similarly, light emitted from the semiconductor light emitting element is not limited to ultraviolet light, but may be visible or infrared light. The kind and compounding ratio of phosphors can also be appropriately selected to obtain any emission color. For example, the phosphors are not limited to three colors of blue, green, and red. Similar effects are achieved by two colors or four or more colors.

Any shape, size, material, and arrangement of various elements including the semiconductor light emitting element, leads, embedding resin, phosphors, fine powder, and sealing resin composing the semiconductor light emitting device that are adapted by those skilled in the art are also encompassed within the scope of the invention as long as they include the features of the invention.

The invention claimed is:

1. A semiconductor light emitting device comprising:
    a semiconductor light emitting element that emits light of a first wavelength;
    a binder resin;
    a plurality of combined bodies including clusters of at least two kinds of phosphors that absorb the light of the first wavelength and then emit wavelength-converted light, wherein surfaces of the at least two kinds of phosphors are bound together preliminarily by the binder resin in the cluster, and
    sealing resin in which the semiconductor light emitting element is embedded and the each of the combined bodies is dispersed while keeping a combination of the at least two kinds of phosphors;
    the at least two kinds of phosphors having different sedimentation rates in the sealing resin before curing, and
    an average sedimentation rate of all the combined bodies being higher than a lowest sedimentation rate of the at least two kinds of phosphors.

2. A semiconductor light emitting device according to claim 1, further including silicone-based resin for combining the at least two kinds of phosphors.

3. A semiconductor light emitting device according to claim 1, further including acrylic resin for combining the at least two kinds of phosphors.

4. A semiconductor light emitting device according to claim 1, wherein
    at least a part of the first wavelength is in a ultraviolet light region,
    the at least two kinds of phosphors include blue phosphors that emit blue light of a second wavelength, green phosphors that emit green light of a third wavelength, and red phosphors that emit red light of a fourth wavelength.

5. A semiconductor light emitting device according to claim 4, configured to emit white light as a mixture of the blue light, the green light, and the red light.

6. A semiconductor light emitting device according to claim 4, wherein the sealing resin is silicone resin.

7. A semiconductor light emitting device according to claim 1, wherein the two kinds of phosphors have different specific gravities.

8. A semiconductor light emitting device comprising:
    a semiconductor light emitting element that emits light of a first wavelength;
    a binder resin;
    a plurality of combined bodies being dispersed in the sealing resin, including a cluster of a plurality of phosphor particles that absorb the light of the first wavelength and then emit wavelength-converted light, wherein surfaces of the phosphor particles are bound together by the binder resin in the cluster,
    the phosphor particles including at least two kinds of phosphor particles,
    sealing resin in which the semiconductor light emitting element is embedded and the each of the combined bodies is dispersed while keeping a combination of the plurality of phosphor particles;
    the at least two kinds of phosphor particles having different sedimentation rates in the sealing resin before curing, and
    an average sedimentation rate of all of the combined bodies being higher than a lowest sedimentation rate of the at least two kinds of phosphor particles.

9. A semiconductor light emitting device according to claim 8, further including silicone-based resin for combining the phosphor particles.

10. A semiconductor light emitting device according to claim 8, further including acrylic resin for combining the phosphor particles.

11. A semiconductor light emitting device according to claim 8, wherein
    at least a part of the first wavelength is in the ultraviolet light region,
    the phosphor particles include blue phosphor particles that emit blue light of a second wavelength, green phosphor particles that emit green light of a third wavelength, and red phosphor particles that emit red light of a fourth wavelength.

12. A semiconductor light emitting device according to claim 11, configured to emit white light as a mixture of the blue light, the green light, and the red light.

13. A semiconductor light emitting device according to claim 11, wherein the sealing resin is silicone resin.

14. A semiconductor light emitting device according to claim 8, wherein the plurality of phosphor particles include at least two kinds of phosphors having different specific gravities.

15. A semiconductor light emitting device comprising:

a semiconductor light emitting element that emits light of a first wavelength;

at least two kinds of phosphors that absorb the light of the first wavelength and then emit wavelength-converted light, the at least two kinds of phosphors having different sedimentation rates; and sealing resin in which the at least two kinds of phosphors are dispersed and the semiconductor light emitting element is embedded, one kind of phosphors of the at least two kinds of phosphors having a higher sedimentation rate than the other of the at least two kinds of phosphors and having a surface on which fine powder is attached and being dispersed in the sealing resin while keeping a combination of the fine powder and the surface, the fine powder being made of material different from and having a smaller grain size than all of the at least two kinds of phosphors, wherein the other of the at least two kinds of phosphors does not have fine powder attached to a surface, and a sedimentation rate of the one kind of phosphors approaching a sedimentation rate of the other of the at least two kinds of phosphors.

16. A semiconductor light emitting device according to claim 15, wherein the fine powder is silica.

17. A semiconductor light emitting device according to claim 15, wherein the fine powder is alumina.

18. A semiconductor light emitting device according to claim 15, wherein the fine powder has an average grain size of not less than 0.01 micrometer and not more than 0.08 micrometer.

19. A semiconductor light emitting device according to claim 15, wherein at least a part of the first wavelength is in the ultraviolet light region, the at least two kinds of phosphors include blue phosphors that emit blue light of a second wavelength, green phosphors that emit green light of a third wavelength, and red phosphors that emit red light of a fourth wavelength.

20. A semiconductor light emitting device according to claim 19, wherein the fine powder is attached to the surface of the phosphors.

21. A semiconductor light emitting device according to claim 19, configured to emit white light as a mixture of the blue light, the green light, and the red light.

22. A semiconductor light emitting device according to claim 19, wherein the sealing resin is silicone resin.

* * * * *